United States Patent
Davids

(10) Patent No.: US 7,509,620 B2
(45) Date of Patent: Mar. 24, 2009

(54) DUAL PHASE SHIFT PHOTOLITHOGRAPHY MASKS FOR LOGIC PATTERNING

(75) Inventor: Paul Davids, Portland, OR (US)

(73) Assignee: Intel Corporation, Santa Clara, CA (US)

(*) Notice: Subject to any disclaimer, the term of this patent is extended or adjusted under 35 U.S.C. 154(b) by 686 days.

(21) Appl. No.: 11/096,991

(22) Filed: Mar. 31, 2005

(65) Prior Publication Data
US 2006/0225025 A1    Oct. 5, 2006

(51) Int. Cl.
    *G06F 17/50*    (2006.01)
(52) U.S. Cl. .............. 716/19; 716/20; 716/21; 430/5; 430/30
(58) Field of Classification Search .......... 719/19–21; 430/5, 30
    See application file for complete search history.

(56) References Cited

U.S. PATENT DOCUMENTS

| | | | |
|---|---|---|---|
| 4,813,761 A * | 3/1989 | Davis et al. | 349/201 |
| 6,525,875 B1 * | 2/2003 | Lauer | 359/371 |
| 6,559,953 B1 | 5/2003 | Davids | |
| 6,833,854 B1 * | 12/2004 | Sandstrom | 347/239 |
| 7,030,997 B2 * | 4/2006 | Neureuther et al. | 356/515 |
| 2004/0265707 A1 * | 12/2004 | Socha | 430/5 |

* cited by examiner

*Primary Examiner*—Vuthe Siek
*Assistant Examiner*—Nghia M Doan
(74) *Attorney, Agent, or Firm*—Blakely, Sokoloff, Taylor & Zafman LLP

(57) ABSTRACT

A pair of phase shift photolithography masks and a process for deriving them is described. In one embodiment, the invention includes deriving a complex electric field estimate for an intended pattern to be produced by phase shift photolithography masks, optimizing the complex electric field estimates, generating a first phase shift mask using the real part of the complex electric field estimates, and generating a second phase shift mask using the imaginary part of the complex electric field estimates.

14 Claims, 4 Drawing Sheets

DUAL PHASE SHIFT PHOTOLITHOGRAPHY MASKS FOR LOGIC PATTERNING

BACKGROUND

1. Field

The present description relates to semiconductor photolithography and, in particular, to generating alternating phase shift photolithography masks.

2. Background

In the production of semiconductors, such as memory, processors, and controllers, among others, a mask is used. The mask pattern is projected onto a semiconductor wafer to expose or shield different portions of the wafer from light, or some other element. The exposed wafer is then processed with etching, deposition and other processes to produce the features of the various semiconductors in the wafer that make up the finished product.

The masks are designed using computer design programs that derive an aerial view or image of the wafer based on the electronic circuitry that is to be built on the wafer. The mask is designed to produce this aerial image on the wafer in the particular photolithography equipment that is to be used. In other words the mask must be designed so that when illuminated with a particular wavelength of light at a particular distance is directed to a wafer through a particular set of optics and the mask, the desired pattern will be formed with the desired intensity on the wafer.

By making the features on a semiconductor smaller, more and faster processing power can be provided in a smaller space. At the same time the energy consumed and the heat produced by the chip is reduced. Smaller features require higher resolution from the mask and optical system that creates the pattern on the wafer. Resolution enhancement techniques (RET) are used to create smaller patterns.

Alternating phase shift masks (APSM) is one type of RET. It uses two independent exposures. For APSM, the design layout pattern is broken up into two independent layers. The first layer is converted to an APSM by an algorithm which assigns phases to create the desired pattern. In general, a complex pattern cannot be assigned phases without conflicts. A phase conflict can result in error in the printing of the features. These phase conflicts are corrected by a second exposure using a trim mask that removes most of the phase conflict errors but limits the resolution.

Optical proximity correction (OPC) is also used to enhance resolution and accuracy for small features. In OPC, the mask pattern is supplemented with very small subresolution features that are used to improve the accuracy with which the pattern is actually produced by the photoresist. These features may include pattern decorations and scatter bars. While the quality of the pattern and the performance of the resulting circuit is improved, the resolution is not significantly increased.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
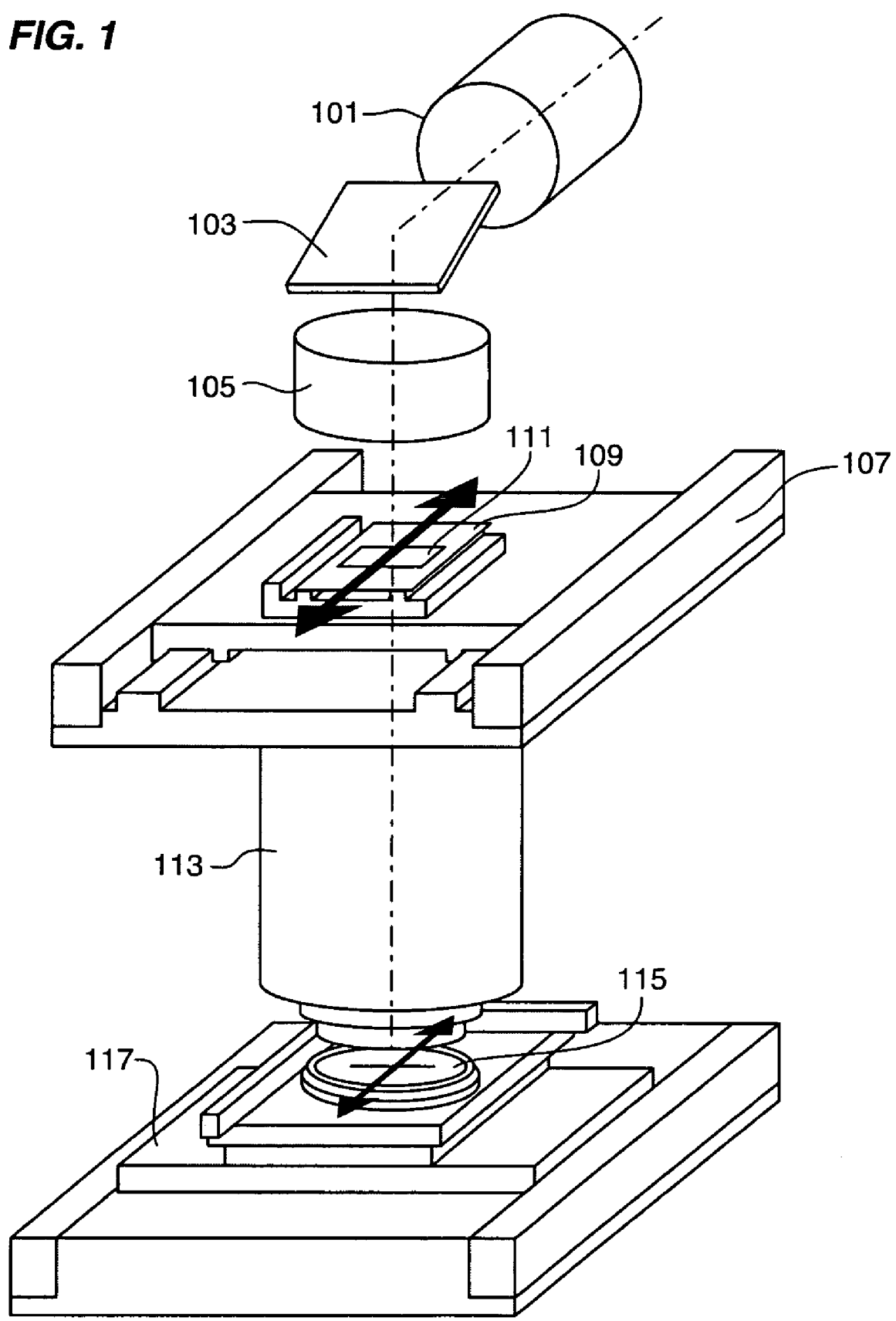
FIG. 1 is a diagram of a semiconductor fabrication device suitable for application to the present invention.

As described below, any layout of logic or memory circuit photolithography patterns may be converted into two optimal phase shift masks, based on a complex representation of the corresponding coherent imaging electric field. The electric field may be iterated in the complex plane and the image intensity (the squared modulus of the electric field) may be monitored for convergence to the input layout or intended design.

The two phase shift masks may be obtained by decomposing the converged imaging electric field into real and imaginary parts, with the real component of the electric field determining one phase mask, and the imaginary component of the electric field determining the other phase mask. Each phase mask is obtained by contouring the real or imaginary component at various electric field thresholds and may be further optimized by modifying the contours to improve the pattern fidelity. The process may be referred to as optimal since it may be used to create a pattern through photolithography which is at or near the limit of optical resolution (e.g. at a k1 factor of 0.25 which corresponds to a half pitch equal to 0.25 times the wavelength divided by the NA of the stepper).

The exposure of the photoresist on the wafer records the intensity (square of the electric field amplitude) projected into the resist. The photoresist is exposed first by one mask and then by the other mask in order to obtain the final pattern. The decomposition of the image intensity can be split uniquely into two exposures, one exposure for the square of the real part of the complex electric field and the other for the square of the imaginary part of the complex electric field. Using real and imaginary parts of the imaging electric field to construct the two masks allows for the elimination of phase conflicts.

The computation of the coherent complex electric field incident on the wafer may be obtained using the methods of Fourier optics. The initial complex field estimate is constructed by taking the mask layout as a binary mask and evaluating the coherent image for the stepper (e.g. at the numerical aperture, NA). The target complex electric field is obtained by considering the mask layout as a binary mask and evaluating the coherent image for an artificial stepper with higher resolution, namely 2NA. The iterated complex electric field amplitude is compared to the target amplitude and monitored for convergence.

Once the convergence criteria has been satisfied, the iteration stops and the last iteration is taken as the optimal complex electric field. Each of the masks is constructed by contouring the continuous real or imaginary electric fields at thresholds set by the maximum and minimum amplitude values. The resulting electric field contours are assigned transmission and phase values; mask transmission 1 (phase 0 degrees), mask transmission −1 (phase 180 Degrees), and mask transmission 0 (chrome). The contour polygons represent the new optimal mask layout and may be further optimized by dividing each contour into a series of segments and moving each segment in such a way as to improve the overall image fidelity, as in a standard OPC procedure.

FIG. 1 shows a conventional semiconductor fabrication machine, in this case, a lens-scanning ArF Excimer Laser Stepper. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 1 is an example of a fabrication device that may benefit from embodiments of the present invention. Embodiments of the invention may also be applied to many other photolithography systems.

The mask controls the size of each feature on the wafer. The mask design is made up of chrome metal lines or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design. Then the physical model is used to adjust the chrome size on the mask to achieve the new desired size on the wafer.

The pixelated mask may be constructed from a quartz plate with transparent or opaque chrome pixels. The pixels are in rows and columns. Each pixel is an area on the quartz plate which is roughly square. The pixels are either transparent (+1, −1), so light passes through or opaque (0) so that the light is blocked. The transparent areas may either reverse the phase of the light as it passes through (−1) or leave the phase of the light unaffected (+1). The pixelated mask can therefore be represented as a matrix of rows and columns with each position in the matrix having a value of +1, 0, or −1.

This matrix is convolved with the kernel function to determine the electric field at all of the positions on the wafer that are caused by exposure to light through the mask. The electric field is of interest because the electric field strength squared is directly related to the effect on the photoresist that is being exposed through the mask. If the electric field strength squared exceeds a certain threshold value then the resist will be exposed sufficiently to be etched away in the next process.

Using embodiments of the present invention, an aerial image may be created that closely matches the designed layout. The aerial image may be determined from taking the electric field intensity created by light falling on the wafer through the optics and the mask and squaring it. With a two-mask process the squared intensities are combined. The electric field intensity is determined, in part by the amplitude of the electric field at each point on the wafer and, in part, by the phase of the electric field at each point on the wafer. By representing the electric field using complex numbers, both the amplitude and phase can be accounted for. An aerial image determined using the complex number representations allows for more optimization degrees of freedom resulting in much higher accuracy in the patterning of the wafer.

The complex numbers used to represent the electric field may also be used to generate the two masks used to create the photolithography image. The real part of the complex numbers may be used to generate one mask and the imaginary part of the complex numbers may be used to generate a second mask. The combined image obtained from the sequential application of the two masks allows very complex shapes to be resolved accurately.

In one embodiment, two alternating phase shift masks (APSM) are defined over an array (columns and rows) of sampling points. The sampling points make up the pixels that will be defined on the two masks as having one of three possible values (−1, 0, +1). The spacing between the points on the sample grid may be selected based on a variety of different factors and to suit different demands for cost, complexity and applications. In one example, the space between sample points may be determined based on some of the characteristics of the photolithography process. Equation 1 provides an example of a set of characteristics that may be used $$\Delta_0 = \lambda/(2M \cdot NA) \qquad \text{Eq. 1}$$

where $\Delta$ is the spacing between the sampling grid points, $\lambda$ is the wavelength of the light used to illuminate the wafer (e.g. about 193 nm), M is the reduction factor of the optical system (e.g. about ¼) and NA is the numerical aperture of the lens (e.g. about 0.85). For higher accuracy estimates of the aerial images a half-sample grid may be used in which the distance between sample grid points $\Delta$ is set equal to ½ $\Delta_0$. This corresponds to a theoretical optical numerical aperture of 2NA.

Figure 2:
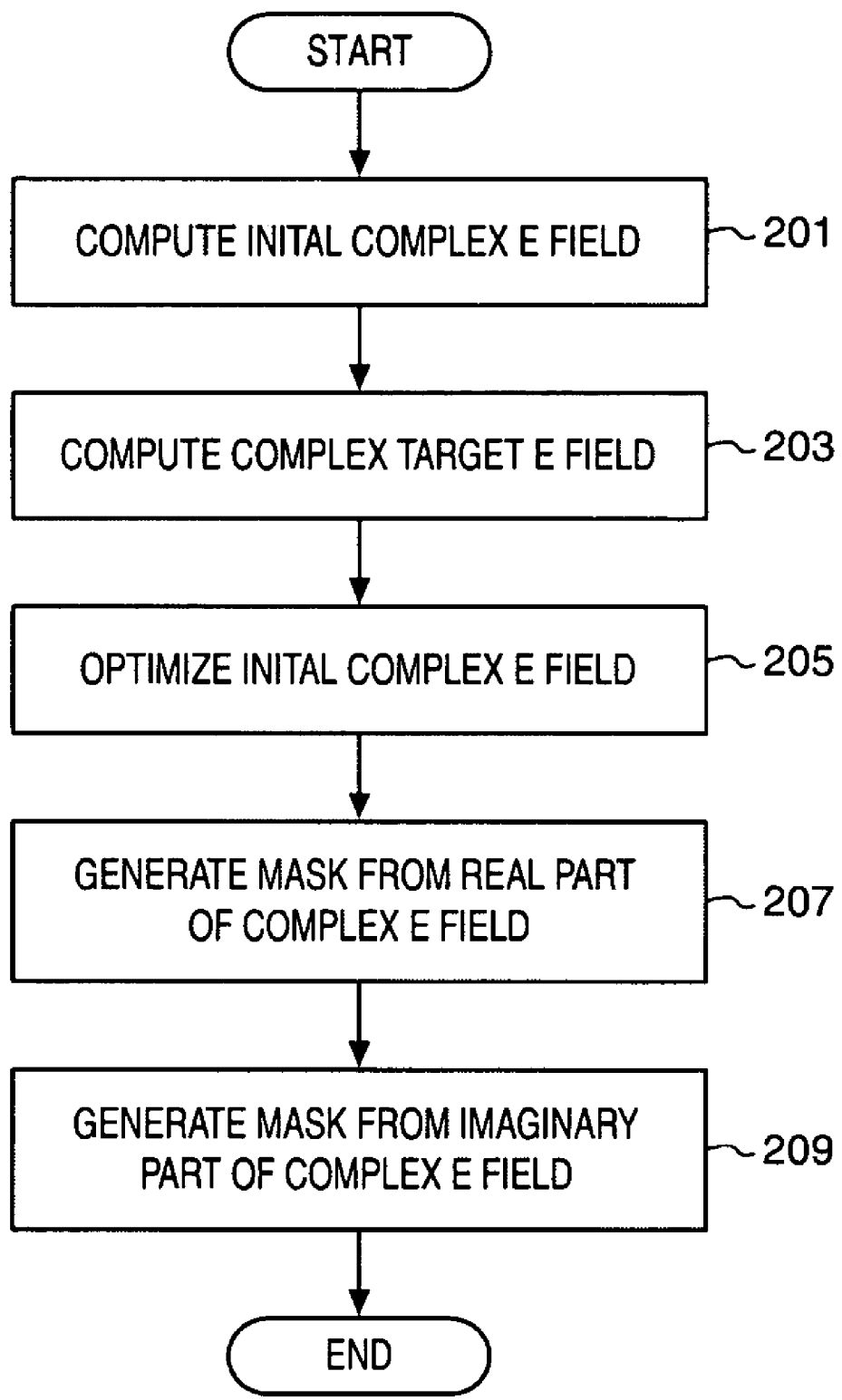
FIG. 2 is a process flow diagram of a modifying a mask according to an embodiment of the present invention.

A generalized process for preparing optimized phase shift masks is shown in FIG. 2. This process begins with the design layout determined based on the intended circuit design. At block 201 a complex electric field estimate is derived. This may be done based on the intended pattern that is to be produced on the wafer using photolithography. In one embodiment, this pattern is converted into a binary mask pattern with mask transmission values (0, 1), then the complex electric field is evaluated using Fourier optics which represents the electric fields that the photolithography equipment will generate transmitting light through the mask. At block 203, the target electric field is computed based on the patterns that are desired, rather than the illumination of the mask through the optics.

At block 205, the calculated complex electric field estimates are optimized by comparison to the intended pattern. This may be done in a variety of different ways. In one embodiment, it is done iteratively by comparing the aerial image that results from a mask to the intended image. The aerial image may be determined based on intensity calculations from the electric field estimates. Other calculations, estimates, approximations and comparisons may also be used. The differences from the comparison are noted and compensated for. The mask is modified accordingly, New estimates are generated based on the new mask and another comparison is made for the new mask. This process is repeated until the desired results are obtained.

At block 207, having optimized the electric field estimates, a phase shift mask is generated based only on the real part of the optimized electric field estimates. At block 209, a second phase shift mask is generated based only on the imaginary part of the optimized electric field estimates. A wafer may be exposed through the two masks one after the other to produce the intended pattern. Either mask may be used first. After exposure by the two masks, the wafer may be subjected to etching and other processes to complete the intended patterning.

Figure 3:
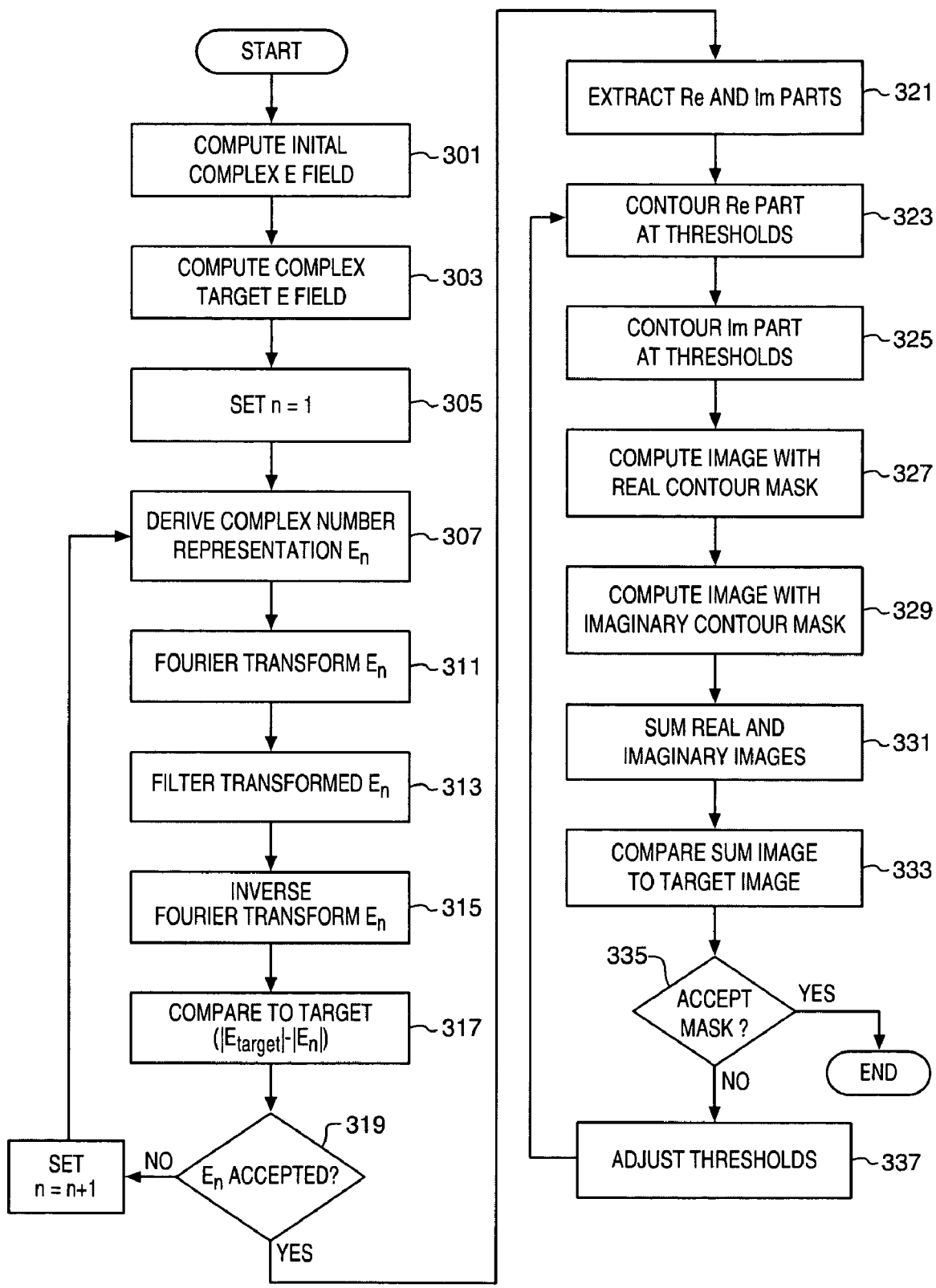
FIG. 3 is another process flow diagram of a modifying a mask according to an embodiment of the present invention.

Another process for designing a pair of APSM masks on a half-sample grid is shown in FIG. 3. Initially, a target design layout is developed that contains patterns that the photolithography process is intended to produce. Based on the design layout, at block 301, an initial complex electric field $E_0$ is computed for a calculated binary mask. This may be calculated on a half-sample grid, using a model of the photolithography process. Next, at block 303, the target electric fields $E_{target}$ are computed using the intended target pattern as a basis for a single binary mask at twice the resolution of the intended stepper (i.e. 2NA). In one embodiment, the patterns are laid out on a half-sample grid. The half-sample grid may be based on an assumption of the theoretical numerical aperture (NA) being doubled (2NA or ½$\Delta_0$). The target electric fields are based on an intended theoretical pattern design and are computed using standard Fourier optics.

At block 305, an iterative loop is started that compares the electric field of the aerial image at the full-sample grid (NA or $\Delta_0$) to that of the intended design, applying filters. This takes the aerial image of the binary mask as derived directly from the intended patterns and compares it back to the intended design. The effects of phase interference and the optics are then revealed by the differences. To start the iterations, a counter n is set to 1 to identify the initial complex field iteration $E_1$.

Based on the electric field evaluation, the mask may be optimized using complex numbers. At block 307, the initial complex field estimate is evaluated from the complex fields generated at block 301 and 303 to determine a new complex number representation of the electric field at each pixel. This initial representation may be called matrix $E_n$, where n=1 initially, and is composed of a complex number for each point on the half-sample grid. At block 307, the general expression for the iterated complex electric fields is shown in Eq. 2 for a specific embodiment.

$$E_{n+1} = E_n + (|E_{target}| - |E_n|)E_n \quad \text{Eq. 2}$$

where $E_{n+1}$ indicates the new revised matrix of complex number electric field values, $E_{target}$ indicates the target electric field values needed to obtain the intended design as computed in block 303, and |x| indicates the magnitude of the value at each pixel or point on the sample grid.

At block 311, a Fourier transformation is applied to the new matrix to convert the electric field values from the spatial domain of binary mask to the frequency domain. This may be represented by Eq. 3

$$F(E_{n+1}) = f(q_x, q_y) \quad \text{Eq. 3}$$

where F indicates a Fourier transform function, such as a fast Fourier transform (FFT) function and $f(q_x, q_y)$ indicates the resulting spatial frequency representation of the electric fields.

At block 313, a filter function is applied to the Fourier transformed results. This filter function, indicated as θ cuts off the contributions to the electric field, that do not pass through the aperture of the imaging optics. The size of the optical aperture through which the mask is imaged onto the wafer puts a limitation on the resolution of the features that can be reproduced on the wafer. Applying a filter that accounts for the aperture of the optical system allows the masks to be designed in a way that also accounts for this aperture. This may allow the resolution on the wafer to approach the physical limits of the optical system. The filter function may be expressed as shown in Equation 4, although other filter functions may be used in addition to or instead of the one shown in Equation 4.

$$f(q_x, q_y)\theta(k \cdot NA \cdot M - |q|) \quad \text{Eq. 4}$$

where θ is the filter function and is a function of k=2π/λ, NA, the numerical aperture of the lens and M the magnification of the lens. |q| indicates the magnitude of the spatial frequency at each pixel or $(q_x^2 + q_y^2)^{1/2}$. The filter function (θ) will be either 1 or 0 depending on whether spatial frequency of the light is within the aperture stop of the stepper.

The filtered Fourier transform of $E_{n+1}$ may then be converted back to the spatial domain by an inverse Fourier transform at block 315. This filtered result may be designated as $E_{fn+1}$. As an alternative to the Fourier transform filter operation described above, a point spread function and the mask transmission function may be convolved to compute the complex electric field. This may be used to yield results similar to multiplying the Fourier transform of the mask with the filter function and inverse transforming. A variety of different spatial frequency representation (Fourier optics) filters or real space representation (convolution) filters may be applied depending on the intended application. In addition, more complex filtering operations may be used to perform a variety of different transformations of the mask. For example, using symmetry in the pupil plane horizontal and vertical decomposition between two masks can be derived.

At block 317, the filtered result is compared to the target. This may be done by comparing the aerial image produced by the new filtered result to the target image or in a variety of other ways. In one embodiment, the aerial image at each pixel is compared to that of the target image. At block 319, the comparison is used to determine whether these filtered results will be accepted or whether another iteration will be performed. In one embodiment, the root mean square (RMS) for the entire grid comparison is derived. If the RMS value is low enough, then the filtered results are accepted. If not then another iteration is performed returning to block 309. After several iterations, the aerial image as represented by $E_{fn}$ may be accepted. At that point, the two APSM masks may be derived.

For an acceptable matrix of complex electric field values, the matrix is divided into its real and imaginary parts at block 317. The final complex matrix may be expressed as E=X+iY, where X is the matrix of the real parts of E and Y is the matrix of imaginary parts of E. One mask may be based on the X values and the other mask may be based on the Y values. The combined aerial image will be the resulting illumination of both parts added together so that the aerial image or intensity $I = |E|^2 = |X|^2 + |Y|^2$. Using complex mathematics, there is no need to take cross products into account.

At block 321, the real and imaginary parts of the resulting electric field values from the iterative filter process are extracted. These are used to generate two binary or phase shift masks that may be applied using, for example, APSM techniques.

At block 323, the values from the real part of E are contoured to further refine the binary mask. In one embodiment, the values from the real part of E are applied to a threshold. The threshold may be based on the amount of illumination needed to expose the intended photoresist. The values are adjusted so that all lines are wide enough or narrow enough to either expose the photoresist or not. This may be done using conventional OPC techniques or any other contouring methodology. At block 325, the values from the imaginary part of E are contoured in a similar way, for example by comparison to a threshold to create the second binary mask.

The imaging of the two masks together may be analyzed to determine if the contouring is sufficient. In other words, since the photoresist will be exposed using both masks, $I=|X|^2+|Y|^2$, the two masks are considered together to determine if the illumination at each pixel after both masks are used will be sufficient to fully expose the desired pattern on the wafer. So, for example, at block 327, an aerial image with the first contoured binary mask based on the real part of the electric field values is computed. Then, at block 329, an aerial image with the second contoured binary mask based on the imaginary part of the electric field values is computed.

At block 329, the two aerial images may be summed. This obtains an aerial image that relates more closely to the pattern that may be obtained by exposing photoresist using the two masks one after the other. The resulting image may then be compared again to the target image at block 333.

At block 335, if the resulting image is acceptable, then the two mask designs are accepted for printing. If not, then the thresholds may be adjusted at block 337 and the process may return to block 323 for further contouring. The iterations of contouring may be applied to each of the two masks until the desired combined aerial image is obtained. Depending on the application, other mask correction techniques may be applied to the resulting masks. These may include OPC and any other mask optimization technique.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex aerial image, electric field value determination, comparison process, aperture filter, and new mask determination may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

Figure 4:
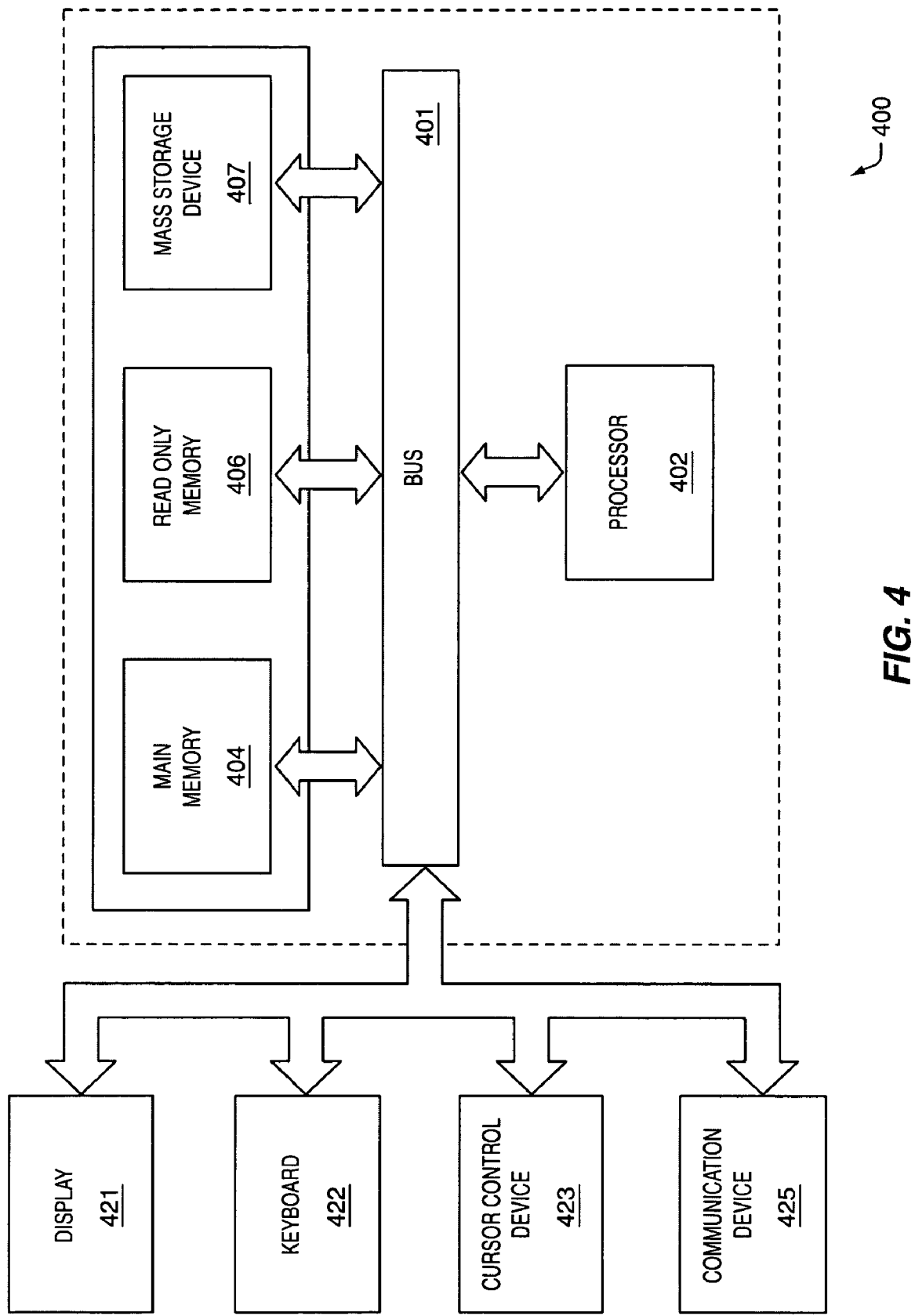
FIG. 4 is an example of a computer system capable of performing aspects of the present invention.

A computer system 400 representing an example of a system upon which features of the present invention may be implemented is shown in FIG. 4. The computer system 400 includes a bus or other communication means 401 for communicating information, and a processing means such as a microprocessor 402 coupled with the bus 401 for processing information. The computer system 400 further includes a main memory 404, such as a random access memory (RAM) or other dynamic data storage device, coupled to the bus 401 for storing information and instructions to be executed by the processor 402. The main memory also may be used for storing temporary variables or other intermediate information during execution of instructions by the processor.

The computer system may also include a nonvolatile memory 406, such as a read only memory (ROM) or other static data storage device coupled to the bus for storing static information and instructions for the processor. A mass memory 407 such as a magnetic disk or optical disc and its corresponding drive may also be coupled to the bus of the computer system for storing information and instructions.

The computer system can also be coupled via the bus to a display device or monitor 421, such as a cathode ray tube (CRT) or Liquid Crystal Display (LCD), for displaying information to a user. For example, graphical and textual indications of installation status, operations status and other information may be presented to the user on the display device. Typically, an alphanumeric input device 422, such as a keyboard with alphanumeric, function and other keys, may be coupled to the bus for communicating information and command selections to the processor. A cursor control input device 423, such as a mouse, a trackball, or cursor direction keys can be coupled to the bus for communicating direction information and command selections to the processor and to control cursor movement on the display 421.

A communication device 425 is also coupled to the bus 401. The communication device 425 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 400 will vary from implementation to implementation depending upon numerous factors, such as price constraints, performance requirements, technological improvements, or other circumstances.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is

1. A method comprising:
deriving complex electric field estimates for an intended pattern to be produced by phase shift photolithography masks on a substrate to be patterned using the masks, the complex electric field estimates having a real part and an imaginary part to represent the electric fields;
optimizing the complex electric field estimates by applying an aperture stop filter to the complex electric field estimates by transforming the electric field estimates into a spatial frequency domain, applying an aperture cutoff function and transforming the transformed filtered estimates out of the spatial frequency domain;

generating a first phase shift mask using the real part of the complex electric field estimates; and generating a second phase shift mask using the imaginary part of the complex electric field estimates.

2. The method of claim 1, further comprising optimizing the complex electric field estimates by checking estimates for convergence to the intended pattern, modifying the estimates and iterating until an acceptable amount of convergence is obtained.

3. The method of claim 1, further comprising contouring the first phase shift mask and independently contouring the second phase mask.

4. The method of claim 1, wherein deriving comprises calculating a binary mask on a half-sample grid.

5. The method of claim 1, further comprising optimizing the complex electric field estimates by comparing the aerial image of the complex electric field estimates to the target design on a full-sample grid.

6. An article including a machine-readable medium containing data, that when executed by the machine, causes the machine to perform operations comprising:

deriving complex electric field estimates for an intended pattern to be produced by phase shift photolithography masks on a substrate to be patterned using the masks, the complex electric field estimates having a real part and an imaginary part to represent the electric fields;

optimizing the complex electric field estimates by applying an aperture stop filter to the complex electric field estimates by transforming the electric field estimates into a spatial frequency domain, applying an aperture cutoff function and transforming the transformed filtered estimates out of the spatial frequency domain;

generating a first phase shift mask using the real part of the complex electric field estimates; and generating a second phase shift mask using the imaginary part of the complex electric field estimates.

7. The article of claim 6, further comprising data, that when executed by the machine, causes the machine to perform operations comprising contouring the first phase shift mask and independently contouring the second phase mask.

8. The article of claim 6, wherein deriving comprises calculating a binary mask on a half-sample grid.

9. The article of claim 8, further comprising optimizing the complex electric field estimates by comparing the aerial image of the complex electric field estimates to the target design on a full-sample grid.

10. An alternating phase shift mask pair comprising:

a first phase shift mask derived from real parts of a grid of complex electric field values, the complex electric field values having a real part and an imaginary part to represent the electric field values, the complex electric field values being optimized by applying an aperture stop filter to a set of complex electric field estimates by transforming the electric field estimates into a spatial frequency domain, applying an aperture cutoff function and transforming the transformed filtered estimates out of the spatial frequency domain; and a second phase shift mask derived from the imaginary parts of the grid of complex electric field values, the phase shift masks being for use in photolithography on a substrate to be patterned using the masks.

11. The alternating phase shift mask pair of claim 10, wherein the first and second phase shift masks have been optimized by comparison of a combined aerial image from the first and second phase shift masks to an intended photolithography pattern.

12. The alternating phase shift mask pair of claim 11, wherein the complex electric field values are determined on a half-sample grid and have been optimized on a full-sample grid.

13. A semiconductor device having a layer produced by photolithography using alternating phase shift masks, the layer being produced using a first phase shift mask derived from the real parts of a grid of complex electric field values, the complex electric field values having a complex part and an imaginary part to represent the electric field values, the complex electric field values being optimized by applying an aperture stop filter to a set of complex electric field estimates by transforming the electric field estimates into a spatial frequency domain, applying an aperture cutoff function and transforming the transformed filtered estimates out of the spatial frequency domain, and a second phase shift mask derived from the imaginary parts of the grid of complex electric field values.

14. The device of claim 13, wherein the first and second phase shift masks have been optimized by comparison of a combined aerial image from the first and second phase shift masks to an intended photolithography pattern.

* * * * *